United States Patent
Chen et al.

(10) Patent No.: US 12,336,132 B2
(45) Date of Patent: Jun. 17, 2025

(54) POSITION-LIMIT MECHANISM AND CHASSIS

(71) Applicant: Fulian Precision Electronics (Tianjin) Co., LTD., Tianjin (CN)

(72) Inventors: Hung-Wei Chen, New Taipei (TW); Tzu-Yao Weng, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 189 days.

(21) Appl. No.: 18/244,478

(22) Filed: Sep. 11, 2023

(65) Prior Publication Data

US 2024/0389259 A1 Nov. 21, 2024

(30) Foreign Application Priority Data

May 19, 2023 (CN) .......................... 202321222561.7

(51) Int. Cl.
*H05K 7/14* (2006.01)

(52) U.S. Cl.
CPC ......... *H05K 7/1489* (2013.01); *H05K 7/1494* (2013.01)

(58) Field of Classification Search
CPC ....................................................... H05K 5/00
See application file for complete search history.

(56) References Cited

U.S. PATENT DOCUMENTS

| 2004/0189162 A1* | 9/2004 | Davis | H05K 7/1425 |
| | | | 312/265.3 |
| 2016/0157376 A1* | 6/2016 | Franz | G11B 33/128 |
| | | | 361/679.02 |

* cited by examiner

*Primary Examiner* — Jerry Wu
(74) *Attorney, Agent, or Firm* — ScienBiziP, P.C.

(57) ABSTRACT

A position-limit mechanism includes a clip retainer and a resilient assembly. The clip retainer includes a fix part, a limit part, a connect part, and a stop part connected in sequence, the fix connected to a frame, a receiving space is defined by the connect part, the stop part, and the limit part, the receiving space is configured for accommodating a mounting bracket, one end of the mounting bracket extends into the receiving space. The resilient assembly is arranged on the limit part and protrudes into the receiving space, the resilient assembly is configured to resiliently press the one end of the mounting bracket in the receiving space. A chassis including the clip retainer as described above is also disclosed.

16 Claims, 6 Drawing Sheets

POSITION-LIMIT MECHANISM AND CHASSIS

FIELD

The subject matter herein generally relates to electronic device protection technologies, and more particularly to a position-limit mechanism and a chassis.

BACKGROUND

Current electronic equipment, such as servers, computers, switches, module cards such as graphics cards, memory cards, and motherboards, is usually installed in a mounting bracket, then the module card is plugged into a module connector of a frame of the electronic equipment, and then the mounting bracket can be secured to the frame through screws. Alternatively, a limit member may be used to limit the distance of movement of the mounting bracket relative to the frame to reduce the probability of the module card loosening from the frame. However, the screws require complex disassembly and assembly processes. The limit member requires a certain installation width for the movement of the mounting bracket, which does not necessarily reduce or eliminate the possibility of the module card loosening from the frame when being affected by environmental factors, such as vibration, and the loosening causes the module card to function failure, such as poor or interrupted signal, and power or thermal conduction.

BRIEF DESCRIPTION OF THE DRAWINGS

Implementations of the present technology will now be described, by way of example only, with reference to the attached figures, wherein.

DETAILED DESCRIPTION

Figure 1:
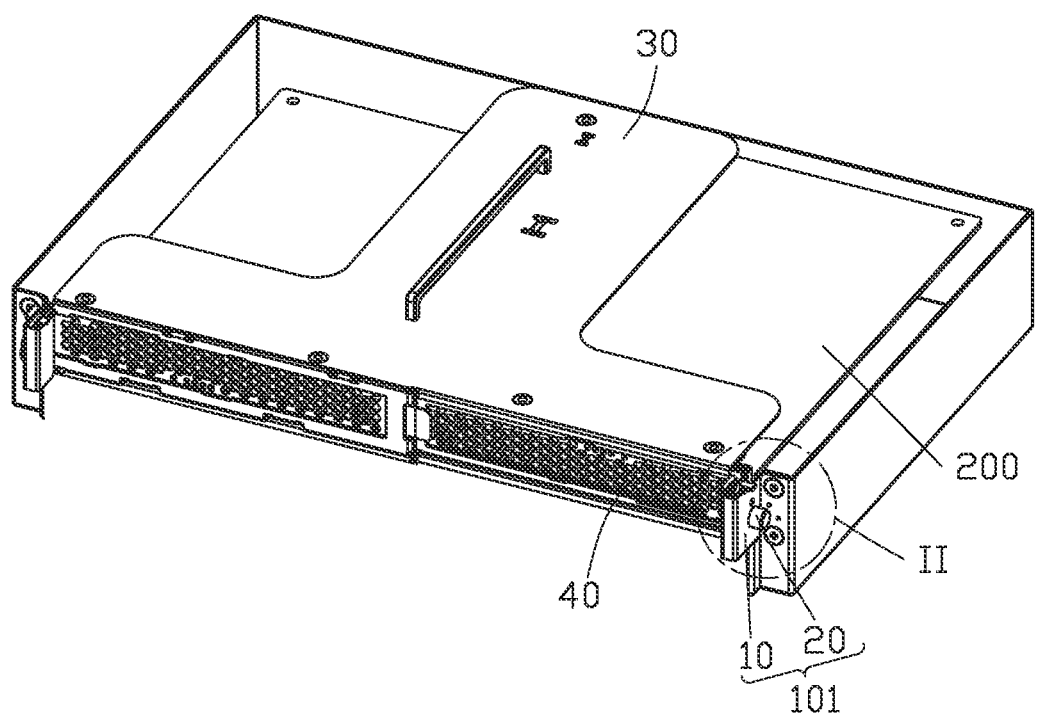
FIG. 1 is a perspective view of a chassis according to an embodiment of the present disclosure, where the chassis is connected to the module card.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

When a feature or element is herein referred to as being "on" another feature or element, it can be directly on the other feature or element or intervening features and/or elements may also be present. It will also be understood that, when a feature or element is referred to as being "connected" or "attached" to another feature or element, it can be directly connected, attached, or coupled to the other feature or element or intervening features or elements may be present.

As shown in FIG. 1, a position-limit mechanism 101 is provided by an embodiment of the disclosure. The position-limit mechanism 101 is configured for limiting a movement of a mounting bracket 40 movably disposed on a frame 30, thereby preventing any loosening of a module card 200 mounted on the mounting bracket 40. The frame 30 may be the bracket of a chassis of an electronic equipment such as a server, a switch, a computer, etc. The module card 200 may be a PCB (Printed Circuit Board) board or a functional module such as a graphics card, a memory card, a motherboard, etc. The module card 200 is plugged into a module connector of the frame 30 by a gold finger. For illustration and understanding, this embodiment is described with the frame 30 serving as the bracket of the chassis of the server and the module card 200 serving as a storage card. However, this is not a limitation of the disclosure. The position-limit mechanism 101 includes a clip retainer 10 and a resilient assembly 20.

Figure 2:
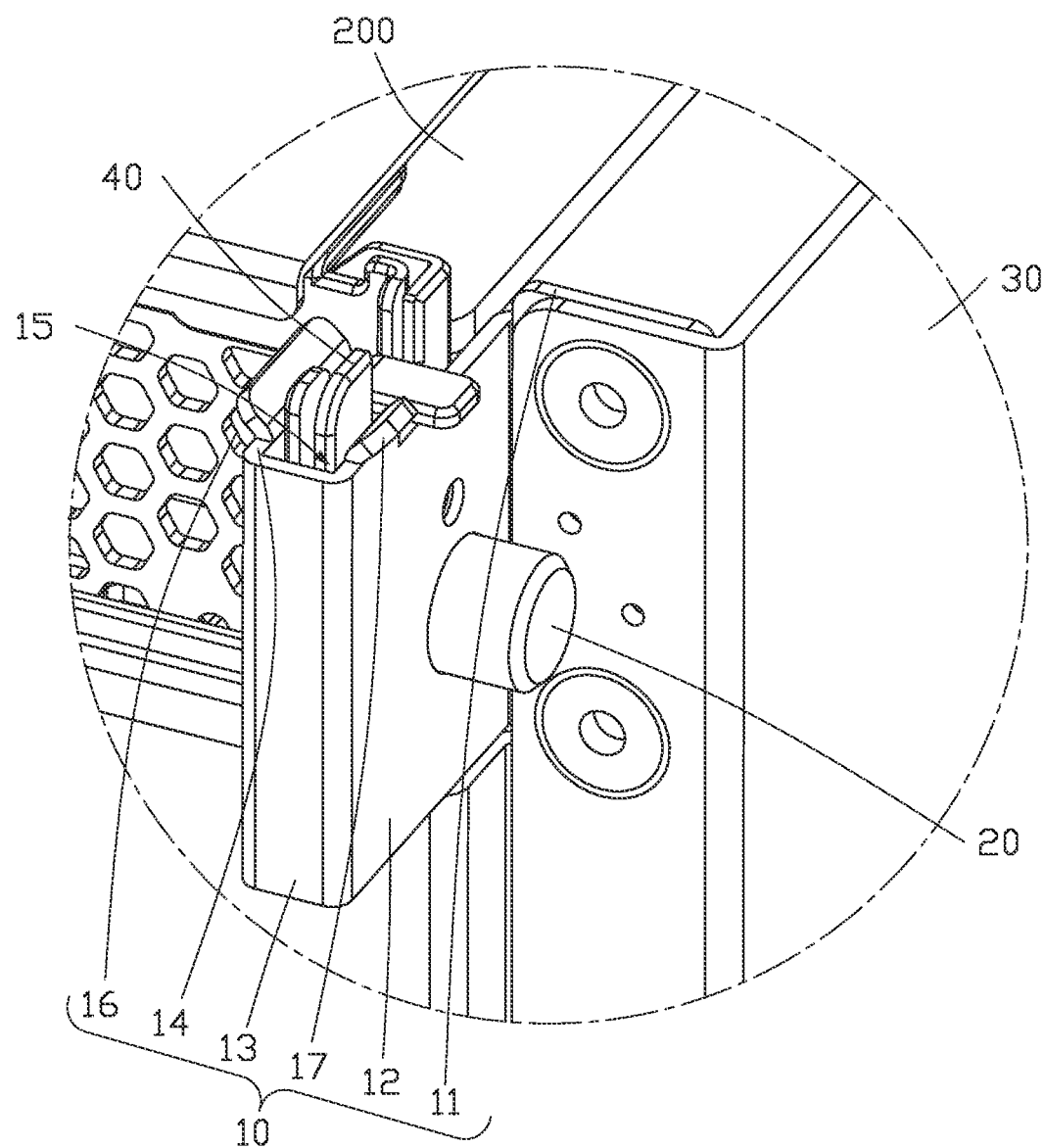
FIG. 2 is an enlarged view of portion II in FIG. 1.

As shown in FIG. 2, the clip retainer 10 includes a fix part 11, a limit part 12, a connect part 13, and a stop part 14 connected in sequence. The fix part 11, the limit part 12, the stop part 13, and the connect part 14 are substantially plate-shaped. The fix part 11 is connected to the frame 30, the fix part 11 is perpendicular to the limit part 12, the limit part 12 is perpendicular to the stop part 13, the stop part 13 is perpendicular to the connect part 14, and a receiving space 15 is defined by the connect part 14, the stop part 13 and the limit part 12, the receiving space 15 is configured for accommodating the mounting bracket 40.

The resilient assembly 20 is arranged on the limit part 12 and protrudes into the receiving space 15. One end of the mounting bracket 40 extends into the receiving space 15. The resilient assembly 20 is configured to resiliently press the one end of the mounting bracket 40 in the receiving space 15.

When the end of the mounting bracket 40 inserts into the receiving space 15, the resilient assembly 20 resiliently presses the mounting bracket 40 against the limit part 12, thus reducing the probability of the mounting bracket 40 driving the module card 200 to loosen.

The clip retainer 10 further includes a first guide part 16 and a second guide part 17. The first guide part 16 and the second guide part 17 are plate-shaped. The first guide part 15 is connected to the connect part 14, the second guide part 17 is connected to the limit part 12, the first guide part 16 is positioned opposite to the second guide part 17 relative to the receiving space 15. The first guide part 16 and the second guide part 17 extend away from each other, the first guide part 16 and the second guide part 17 are configured to guide the mounting bracket 40 inserting into the receiving space 15.

In this embodiment, the fix part 11, the limit part 12, the stop part 13, the connect part 14, the first guide part 16, and the second guide part 17 may be integrally formed by stamping, die casting, or injection molding, thus improving the institutional strength of the clip retainer 10.

Figure 3:
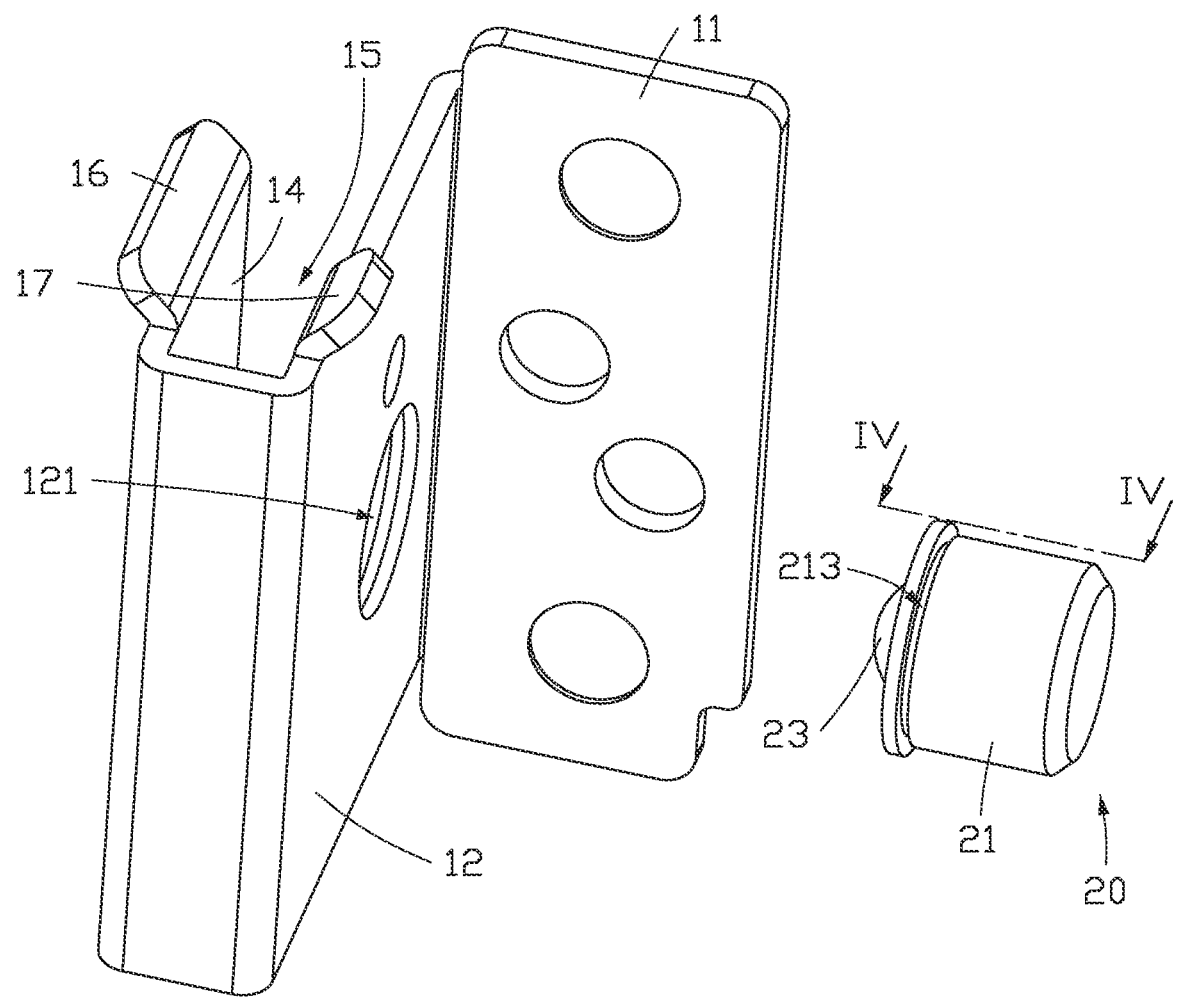
FIG. 3 is an explosive view of a position-limit mechanism shown in FIG. 1.
Figure 4:
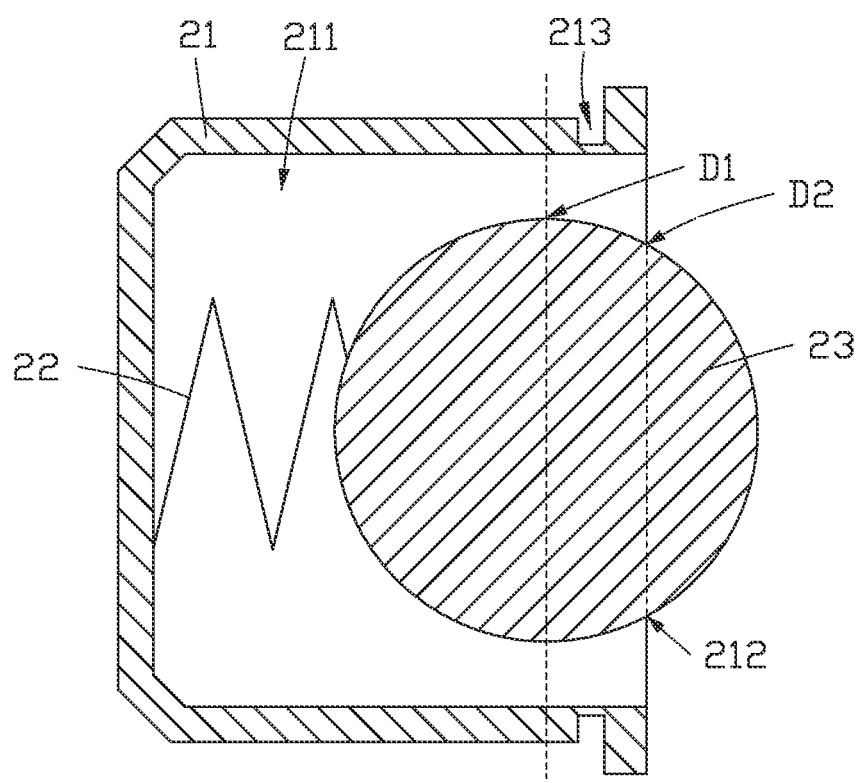
FIG. 4 is a cross-sectional schematic view of a resilient limit assembly in the position-limit mechanism shown in FIG. 3 along IV-IV.

As shown in FIG. 3 and FIG. 4, The limit part 12 defines an assembly hole 121, the resilient assembly 20 includes a housing 21, a resilient member 22 and a limit ball 23. The housing 21 is inserted into the assembly hole 121. The housing 21 is a hollow cylinder, one end of which is enclosed for defining a receiving groove 211, the other end of the hollow cylinder defines an opening 212 facing the receiving space 15. The resilient member 22 and the limit ball 23 are arranged in the receiving groove 211, one end of the resilient member 22 is connected to a bottom of the receiving groove 211, another end of the resilient member 22 is connected to the limit ball 23 for pressing the limit ball 23 to protrudes from the opening 212 and resiliently presses the mounting bracket 40, in this embodiment, the resilient member 22 may be a spring. According to some embodiments, a first diameter D1 of the limit ball 23 is greater than a second diameter D2 of the opening 212, thus only a portion of the limit ball 23 protrudes from the opening 212 and resiliently resist the mounting bracket 40, the limit ball 23 is driven by the resilient member 22 may generate a thrust force of 460 gf-2000 gf (gram-force).

The housing 21 defines a riveting slot 213 along its outer circumference, the riveting slot 213 is located at one end of the housing 21 near the receiving space 15, the riveting slot 213 is configured for riveting to an inner wall of the assembly hole 121. In this way, it is easy to quickly connect the resilient assembly 20 to the limit part 12 and to improve the stability of the resilient limit assembly 20 after it is connected to the limit part 12.

Figure 5:
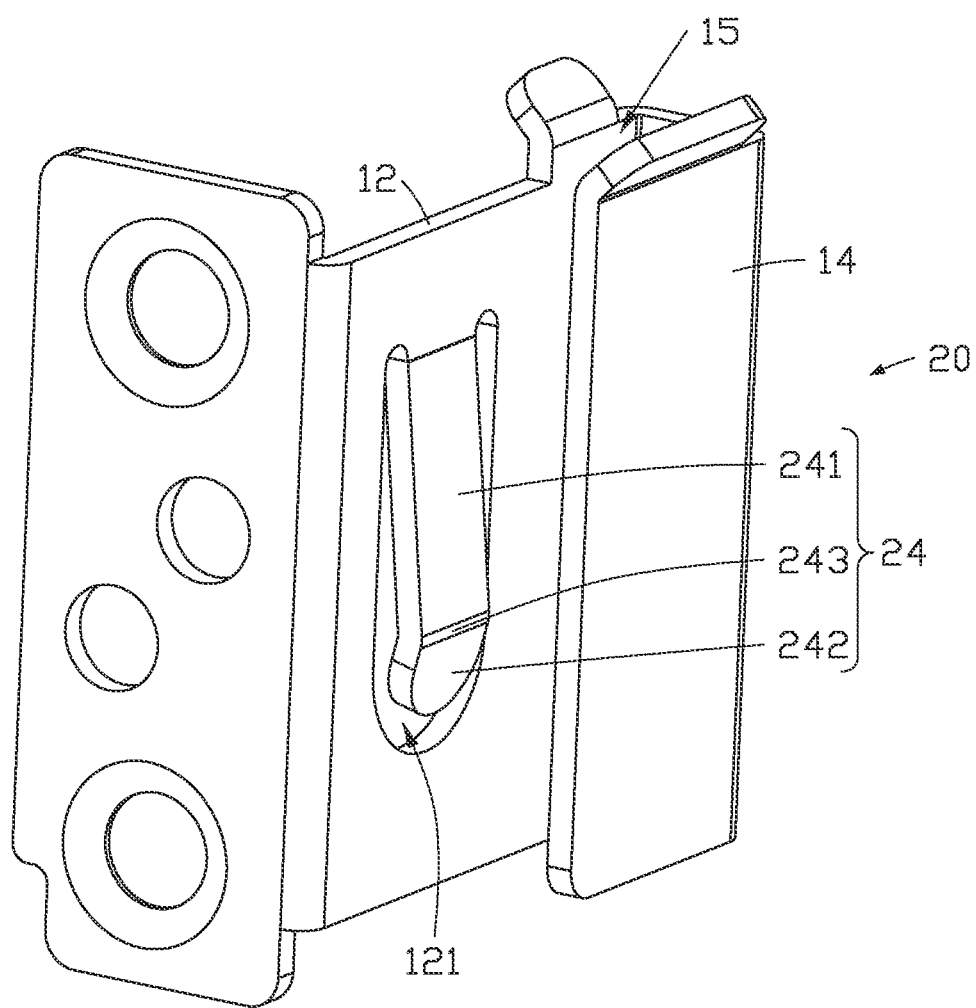
FIG. 5 is a perspective view of a position-limit mechanism according to another embodiment of the present disclosure.

As shown in FIG. 5, according to some embodiments, the limit part 12 defines an assembly hole 121, the resilient assembly 20 further includes a snap-in member 24, the snap-in member 24 is provided in the assembly hole 121, and the snap-in member 24 is tilted toward the receiving space 15, the snap-in member 24 is configured for resiliently pressing the mounting bracket 40. The snap-in member 24 may be attached to an inner wall of the assembly hole 121 by welding, stamping, mold casting, injection molding, etc. The snap-in member 24 may generate a thrust of 2100 gf-4300 gf. In this way, the structure is simple and inexpensive to manufacture.

The snap-in member 24 includes a tilt part 241 and a bend part 242, one end of the tilt part 241 is connected an inner wall of the assembly hole 121, another end of the tilt part 241 extends into the receiving space 15 and is connected to the bend part 242, the bend part 242 extends from the tilt part 241 to the limit part 12, and a connection between the bend part 242 and the tilt part 241 forms a contact arc surface 243, the contact arc surface 243 is configured for pressing the mounting bracket 40. When the mounting bracket 40 is inserted or pulled out of the receiving space 15, the tilt part 241 and the bend part 242 arranged in such a way avoids occurrence of locking the mounting bracket 40, and the contact arc surface 243 reduces the wear on the mounting bracket 40.

In summary, when the mounting bracket 40 is inserted into the receiving space 15, the position-limit mechanism 101 can retain the mounting bracket 40 in position by pressing the resilient assembly 20 against the mounting bracket 40, thus the mounting bracket 40 is assembled. When the mounting bracket 40 is pulled out of the receiving space 15, the mounting bracket 40 can be detached from the frame 30 without using any external tools, thus improving the convenience of disassembling the mounting bracket 40. The resilient assembly 20 resiliently presses against the mounting bracket 40 and limit the movement of the mounting bracket 40, thereby reducing the probability of the module card 200, which is driven by the mounting bracket 40, loosening from the frame 30.

Figure 6:
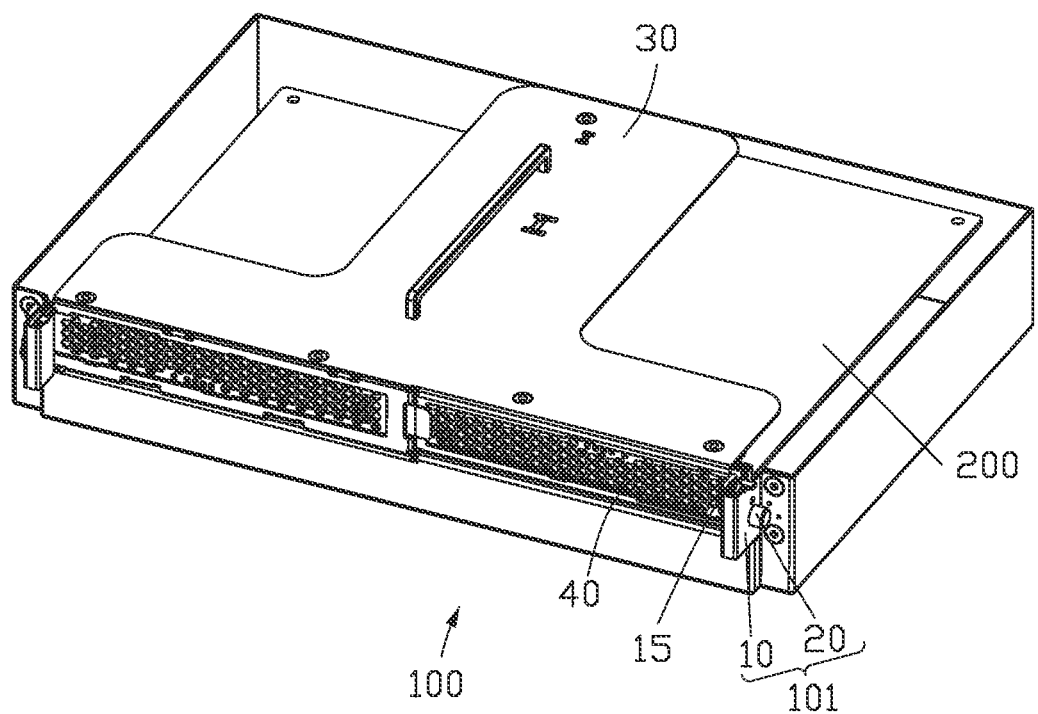
FIG. 6 is a perspective view of a chassis according to another embodiment of the present disclosure, where the chassis is connected to the module card.

As shown in FIG. 6, a chassis 100 is provided by an embodiment of the disclosure. The chassis 100 includes the position-limit mechanism 101 as described above, a frame 30, and a mounting bracket 40. The position-limit mechanism 101 is attached to the frame 30 by the limit part 12 of the clip retainer 10. The mounting bracket 40 is attached to the module card 200 and drives the module card 200 to be connected to the chassis 100. The mounting bracket 40 is inserted into the receiving space 15 and is contacted with the resilient assembly 20.

The process of mounting the module card 200 to the chassis 100 mainly includes: connecting the module card 200 to the mounting bracket 40, plugging the module card 200 into the connector of the frame 30 by the mounting bracket 40, and inserting the end of the mounting bracket 40 into the receiving space 15 of the clip retainer 10, and the resilient assembly 20 resiliently press the end of the assembly piece 40.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A position-limit mechanism for positioning a mounting bracket slidably arranged on a frame, comprising: a clip retainer comprising a fix part, a limit part, a connect part, and a stop part connected in sequence, the fix part is configured to connect to the frame, a receiving space is defined by the connect part, the stop part, and the limit part, the receiving space is configured for accommodating the mounting bracket, one end of the mounting bracket extends into the receiving space; and a resilient assembly, the resilient assembly is arranged on the limit part and protrudes into the receiving space, the resilient assembly is configured to resiliently press the one end of the mounting bracket in the receiving space to limit a movement of the mounting bracket movably disposed on the frame; and the resilient assembly comprises: a housing, the housing is arranged on the limit part, the housing is a hollow cylinder, one end of the housing is enclosed for defining a receiving groove, another end of the hollow cylinder defines an opening facing the receiving space; a resilient member, the resilient member is arranged in the receiving groove; and a limit ball, the limit ball is arranged in the receiving groove, one end of the resilient member is connected to a bottom of the receiving groove, another end of the resilient member is connected to the limit ball for pressing the limit ball to protrudes from the opening and resiliently presses the mounting bracket.

2. The position-limit mechanism of claim 1, wherein the limit part defines an assembly hole, the housing defines a riveting slot along an outer circumference of the housing, the riveting slot is located at an end of the housing near the receiving space, the riveting slot is configured for riveting to an inner wall of the assembly hole.

3. The position-limit mechanism of claim 1, wherein a first diameter of the limit ball is greater than a second diameter of the opening.

4. The position-limit mechanism of claim 2, wherein the resilient assembly further comprises a snap-in member, the snap-in member is provided in the assembly hole, and the snap-in member is tilted toward the receiving space, the snap-in member is configured for resiliently pressing the mounting bracket.

5. The position-limit mechanism of claim 4, wherein the snap-in member comprises:
   a tilt part, one end of the tilt part is connected an inner wall of the assembly hole, another end of the tilt part extends into the receiving space; and
   a bend part, the bend part is connected to the tilt part, the bend part extends from the tilt part to the limit part.

6. The position-limit mechanism of claim 5, wherein a connection between the bend part and the tilt part forms a contact arc surface, the contact arc surface is configured for pressing the mounting bracket.

7. The position-limit mechanism of claim 1, wherein the clip retainer further comprising:
   a first guide part, the first guide part is connected to the connect part; and
   a second guide part, the second guide part is connected to the limit part, the first guide part is positioned opposite to the second guide part relative to the receiving space, the first guide part and the second guide part extend away from each other, the first guide part and the second guide part are configured to guide the mounting bracket inserting into the receiving space.

8. The position-limit mechanism of claim 7, wherein the fix part, the limit part, the connect part, the stop part, the first guide part, and the second guide part are integrally formed.

9. A chassis, comprising: a position-limit mechanism, comprising: a clip retainer comprising a fix part, a limit part, a connect part, and a stop part connected in sequence, the fix part connected to a frame, a receiving space is defined by the connect part, the stop part, and the limit part; and a resilient assembly, the resilient assembly is arranged on the limit part and protrudes into the receiving space; the position-limit mechanism is attached to the frame by the limit part of the clip retainer; and a mounting bracket, the mounting bracket is received in the receiving space and slidably arranged on the frame, one end of the mounting bracket extends into the receiving space and is resiliently pressed by the resilient assembly, the mounting bracket is attached to a module card and drives the module card to be connected to the chassis, the mounting bracket is inserted into the receiving space and is contacted with the resilient assembly; and the clip retainer further comprising: a first guide part, the first guide part is connected to the connect part; and a second guide part, the second guide part is connected to the limit part, the first guide part is positioned opposite to the second guide part relative to the receiving space, the first guide part and the second guide part extend away from each other, the first guide part and the second guide part are configured to guide the mounting bracket inserting into the receiving space.

10. The chassis of claim 9, wherein the resilient assembly comprises:
   a housing, the housing is arranged on the limit part, the housing is a hollow cylinder, one end of the housing is enclosed for defining a receiving groove, another end of the hollow cylinder defines an opening facing the receiving space;
   a resilient member, the resilient member is arranged in the receiving groove; and
   a limit ball, the limit ball is arranged in the receiving groove, one end of the resilient member is connected to a bottom of the receiving groove, another end of the resilient member is connected to the limit ball for pressing the limit ball to protrudes from the opening and resiliently presses the mounting bracket.

11. The chassis of claim 10, wherein the limit part defines an assembly hole, the housing defines a riveting slot along an outer circumference of the housing, the riveting slot is located at an end of the housing near the receiving space, the riveting slot is configured for riveting to an inner wall of the assembly hole.

12. The chassis of claim 10, wherein a first diameter of the limit ball is greater than a second diameter of the opening.

13. The chassis of claim 11, wherein the resilient assembly further comprises a snap-in member, the snap-in member is provided in the assembly hole, and the snap-in member is tilted toward the receiving space, the snap-in member is configured for resiliently pressing the mounting bracket.

14. The chassis of claim 13, wherein the snap-in member comprising:
   a tilt part, one end of the tilt part is connected an inner wall of the assembly hole, another end of the tilt part extends into the receiving space; and
   a bend part, the bend part is connected to the tilt part, the bend part extends from the tilt part to the limit part.

15. The chassis of claim 14, wherein a connection between the bend part and the tilt part forms a contact arc surface, the contact arc surface is configured for pressing the mounting bracket.

16. The chassis of claim 9, wherein the fix part, the limit part, the connect part, the stop part, the first guide part, and the second guide part are integrally formed.

* * * * *